(12) United States Patent
Geren

(10) Patent No.: US 8,400,166 B2
(45) Date of Patent: Mar. 19, 2013

(54) NON-DESTRUCTIVE DETERMINATION OF ELECTROMAGNETIC PROPERTIES

(75) Inventor: William Preston Geren, Shoreline, WA (US)

(73) Assignee: The Boeing Company, Chicago, IL (US)

(*) Notice: Subject to any disclaimer, the term of this patent is extended or adjusted under 35 U.S.C. 154(b) by 457 days.

(21) Appl. No.: 12/432,461

(22) Filed: Apr. 29, 2009

(65) Prior Publication Data

US 2010/0277184 A1 Nov. 4, 2010

(51) Int. Cl.
*G01R 27/04* (2006.01)
(52) U.S. Cl. ........ 324/637; 342/165; 342/173; 342/174; 342/375
(58) Field of Classification Search .................. 324/637
See application file for complete search history.

(56) References Cited

U.S. PATENT DOCUMENTS

| | | | |
|---|---|---|---|
| 4,255,702 A * | 3/1981 | Tricoles et al. ............... | 324/637 |
| 4,274,048 A * | 6/1981 | Tricoles et al. ............... | 324/637 |
| 4,581,574 A * | 4/1986 | Goodman et al. ............ | 324/639 |
| 4,607,212 A * | 8/1986 | Jakkula ........................ | 324/637 |
| 4,707,652 A * | 11/1987 | Lowitz .......................... | 324/631 |
| 4,805,627 A * | 2/1989 | Klingenbeck et al. ........ | 600/425 |
| 5,291,422 A | 3/1994 | Esztergar | |
| 5,428,360 A * | 6/1995 | Tam et al. ..................... | 342/165 |
| 5,923,174 A * | 7/1999 | Darling, Jr. ................... | 324/637 |
| 6,529,157 B1 * | 3/2003 | Mensa et al. ................. | 342/173 |
| 6,756,789 B1 * | 6/2004 | Parker et al. .................. | 324/637 |
| 6,859,046 B2 * | 2/2005 | Schajer .......................... | 324/637 |
| 6,927,725 B2 * | 8/2005 | Wittenberg et al. .......... | 342/174 |
| 6,975,268 B2 * | 12/2005 | Coleman et al. .............. | 342/375 |
| 7,777,499 B2 * | 8/2010 | Little, Jr. ........................ | 324/637 |
| 7,791,355 B1 * | 9/2010 | Esher et al. .................... | 324/637 |
| 2003/0098697 A1 * | 5/2003 | Tanaka .......................... | 324/637 |
| 2003/0173977 A1 * | 9/2003 | Little, Jr. ........................ | 324/637 |
| 2003/0218468 A1 * | 11/2003 | Holmes ......................... | 324/637 |
| 2004/0075443 A1 * | 4/2004 | Hemming et al. ............ | 324/637 |
| 2005/0128136 A1 * | 6/2005 | Wittenberg et al. .......... | 342/174 |
| 2007/0046298 A1 * | 3/2007 | Safai et al. .................... | 324/637 |
| 2009/0009191 A1 * | 1/2009 | Little, Jr. ........................ | 324/639 |
| 2009/0284408 A1 * | 11/2009 | Bernhardt et al. ............ | 342/174 |
| 2010/0085066 A1 * | 4/2010 | Peschmann et al. .......... | 324/637 |
| 2010/0141271 A1 * | 6/2010 | Niklas et al. .................. | 324/637 |
| 2011/0181300 A1 * | 7/2011 | Bowring et al. .............. | 324/637 |

OTHER PUBLICATIONS

Bric, Allen J., "Imaging a BQM-74E Target Drone using Coherent Radar Cross Section Measurements", Johns Hopkins APL Technical Digest, vol. 18, No. 3, 1997, pp. 365-366.*

(Continued)

*Primary Examiner* — Melissa Koval
*Assistant Examiner* — Benjamin M Baldridge
(74) *Attorney, Agent, or Firm* — Toler Law Group

(57) ABSTRACT

Systems and methods to determine electromagnetic properties are provided. A particular method includes directing electromagnetic energy toward an article under test. The method also includes taking measurements of electromagnetic energy scattered by the article under test. The method further includes determining expected baseline values of at least one electromagnetic property of the article under test. The expected baseline values are based on electromagnetic energy scattered by a control article. The method also includes determining output data based on a difference between the expected baseline values and characteristic values of the article under test determined based on the measurements of electromagnetic energy scattered by the article under test. The output data includes values indicative of inhomogeneous distribution of an electromagnetic property of the article under test.

19 Claims, 5 Drawing Sheets

OTHER PUBLICATIONS

Gao, Guozhong et al., "High Order Generalized Extended Born Approximation for Electromagnetic Scattering", IEEE Transactions on Antennas and Propagation, vol. 54, No. 4, Apr. 2006, pp. 1243-1256.*

Devaney, A. J., Imaging and Target Detection from Unstructured and Sparse Antenna Arrays, Adaptive Sensor Array Workshop, Mar. 11, 2003, MIT Lincoln Laboratory, Cambridge, MA, pp. 1-6.*

Giovanni Leone et al., Inverse scattering under the distorted Born approximation for cylindrical geometries, Optical Society of America Journal, Jul. 1999, vol. 16, No. 7, pp. 1779-1787.

Adriana Brancaccio et al., Information content of Born scattered fields: results in the circular cylindrical case, Optical Society of America Journal, Jul. 1998, vol. 15, No. 7, pp. 1909-1917.

Janice Y. Cheng et al., Inverse scattering and diffraction tomography in cylindrical background media, Optical Society of America Journal, May 2006, vol. 23, No. 5, pp. 1038-1047.

Mark F. Smith et al., Reconstruction of SPECT Images Using Generalized Matrix Inverses, IEEE Transactions on Medical Imaging, Jun. 1992, vol. 11, No. 2, pp. 165-175.

* cited by examiner

NON-DESTRUCTIVE DETERMINATION OF ELECTROMAGNETIC PROPERTIES

FIELD OF THE DISCLOSURE

The present disclosure is generally related to non-destructive determination of electromagnetic properties.

BACKGROUND

Materials used in manufacturing processes may be associated with a specification that indicates particular characteristics that the materials are expected to possess. For example, the specification may indicate electrical properties of a particular material have to meet the specification. To determine whether the materials meet the specification, the materials may be tested. Tests to determine electrical characteristics of the materials may be destructive or non-destructive.

Generally, destructive tests include tests that extract a sample portion of the material to be tested. For example, a sample portion of the material may be cut off of a block of the material. The sample portion may then be subjected to tests to determine properties of the sample portion. However, when the material is inhomogeneous, the sample portion may not be representative of other portions of the material.

Non-destructive testing may include subjecting a sample portion or an entire body of the material to tests to determine properties of the material. However, non-destructive testing methods may also have difficulty identifying inhomogeneous properties of the material or properties that depend upon test conditions that are varied. For example, swept frequency radar (also referred to as inverse synthetic aperture radar (ISAR)) may use a variable frequency to determine a dielectric constant of a block of a material. However, ISAR may have difficulty determining frequency dependence of the dielectric constant since ISAR may sweep the frequency during testing.

SUMMARY

In a particular embodiment, a non-destructive method to determine electromagnetic properties includes directing electromagnetic energy toward an article under test. The method also includes taking measurements of electromagnetic energy scattered by the article under test. The method further includes determining expected baseline values of at least one electromagnetic property of the article under test. The expected baseline values are based on electromagnetic energy scattered by a control article. The method also includes determining output data based on a difference between the expected baseline values and characteristic values of the article under test determined based on the measurements of electromagnetic energy scattered by the article under test. The output data include values indicative of inhomogeneous distribution of an electromagnetic property of the article under test.

In another particular embodiment, a computer-readable storage medium includes instructions executable by a processor to access expected baseline values of an article under test based on electromagnetic energy scattered by a control article. The computer-readable storage medium also includes instructions executable by the processor to determine difference values between the expected baseline values and characteristic values of the article under test. The characteristic values of the article under test are determined based on electromagnetic energy scattered by the article under test when an electromagnetic plane wave is directed toward the article under test. The computer-readable storage medium further includes instructions executable by the processor to determine output data based on the difference values. The output data includes values indicative of inhomogeneous distribution of an electromagnetic property of the article under test.

In another particular embodiment, a system includes an antenna to direct an electromagnetic plane wave toward an article under test. The system also includes at least one probe to take measurements of electromagnetic energy scattered by the article under test. The system further includes a memory storing expected baseline values of at least one electromagnetic property of the article under test. The expected baseline values are based on electromagnetic energy scattered by a control article. The system also includes a processor to determine output data including difference values between the expected baseline values and a plurality of measured characteristic values of the article under test determined based on the measurements of electromagnetic energy scattered by the article under test. The output data includes values indicative of inhomogeneous distribution of an electromagnetic property of the article under test.

DETAILED DESCRIPTION

The features, functions, and advantages that are discussed can be achieved independently in various embodiments disclosed herein or may be combined in yet other embodiments, further details of which can be shown with reference to the following description and drawings.

By way of introduction, the systems and methods disclosed enable non-destructive determination of electromagnetic properties. For example, the systems and methods may enable determination of the frequency dependence and spatial distribution of the dielectric inhomogeneity of tailored dielectric materials. To illustrate, the non-destructive systems and methods to determine electromagnetic properties may use microwave tomography to gather data about an electromagnetic field near the tailored dielectric material caused by scattering of a plane wave. The data may be gathered from a plurality of incident angles and at a plurality of frequencies of the plane wave. A distorted wave Born approximation may be used to determine difference data between expected values of the electromagnetic field and values determined during testing of the tailored dielectric material. The expected values may be determined by testing a control article that has a substantially homogeneous dielectric constant. The difference data may be analyzed using the singular value decomposition method to determine output data. The output data may be compared to a specification for the tailored dielectric material to determine whether the tailored dielectric material conforms to the specification and whether a manufacturing process used to generate the tailored dielectric material should be adjusted.

Figure 1:
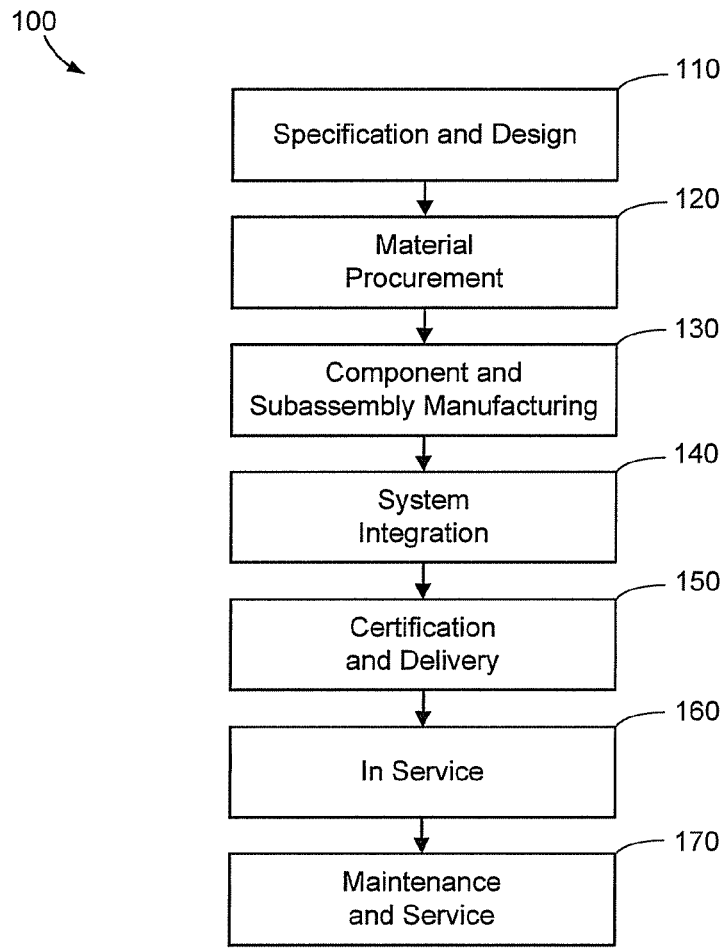
FIG. 1 is a flow diagram of an aircraft production and service methodology.
Figure 2:
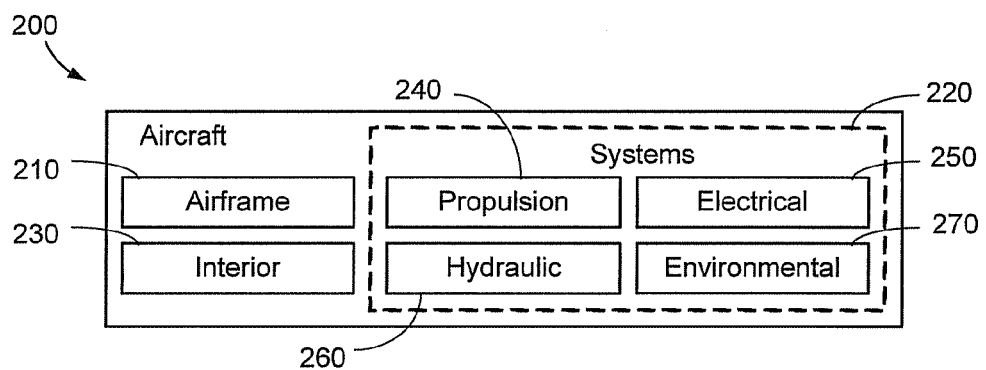
FIG. 2 is a block diagram of functional groups of aircraft systems.

Referring more particularly to the drawings, embodiments of the disclosure may be described in the context of an aircraft manufacturing and service method 100 as shown in FIG. 1 and functional aspects of an aircraft 200 as shown in FIG. 2. During pre-production, an exemplary method 100 may include specification and design 110 of the aircraft 200 and material procurement 120. During production, component and subassembly manufacturing 130 and system integration 140 of the aircraft 200 takes place. Thereafter, the aircraft 200 may go through certification and delivery 150 in order to be placed in service 160. While in service by a customer, the aircraft 200 is scheduled for routine maintenance and service 170 (which may also include modification, reconfiguration, refurbishment, and so on).

Each of the processes of the method 100 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, a leasing company, a military entity, a service organization, and so on.

As shown in FIG. 2, the aircraft 200 produced by the exemplary method 100 may include an airframe 210 with a plurality of systems 220 and an interior 230. Examples of high-level systems 220 include one or more of a propulsion system 240, an electrical system 250, a hydraulic system 260, and an environmental system 270. Any number of other systems may be included. Electrical characteristics of some components or portions of the aircraft 200 may be important to the manufacture or operation of the aircraft 200. For example, certain components or portions of the aircraft 200 may be manufactured using tailored dielectric materials that have particular electromagnetic properties. At various stages of the life of the aircraft 200, such as during specification and design 110, material procurement 120, manufacturing 130, or maintenance and service 170, certain materials used for the aircraft 200 may be tested to determine whether the electrical characteristics of the materials are acceptable. Additionally, although an aerospace example is shown, the principles of the various embodiments may be applied to other industries, such as the automotive industry, the ship building industry, the wind power industry or other industries where electromagnetic properties of materials are evaluated.

Apparatus and methods embodied herein may be employed during any one or more of the stages of the production and service method 100. For example, components or subassemblies corresponding to the component and subassembly manufacturing process 130 may be fabricated or manufactured in a manner similar to components or subassemblies produced while the aircraft 200 is in its in service phase 160. Also, one or more apparatus embodiments, method embodiments, or a combination thereof, may be utilized during the production stages, such as the component and subassembly manufacturing stage 130 or the system integration stage 140, for example, by substantially expediting assembly of or reducing the cost of the aircraft 200. Similarly, one or more of the apparatus embodiments, the method embodiments, or a combination thereof, may be utilized while the aircraft 200 is in service, for example and without limitation, during the maintenance and service stage 170.

Figure 3:
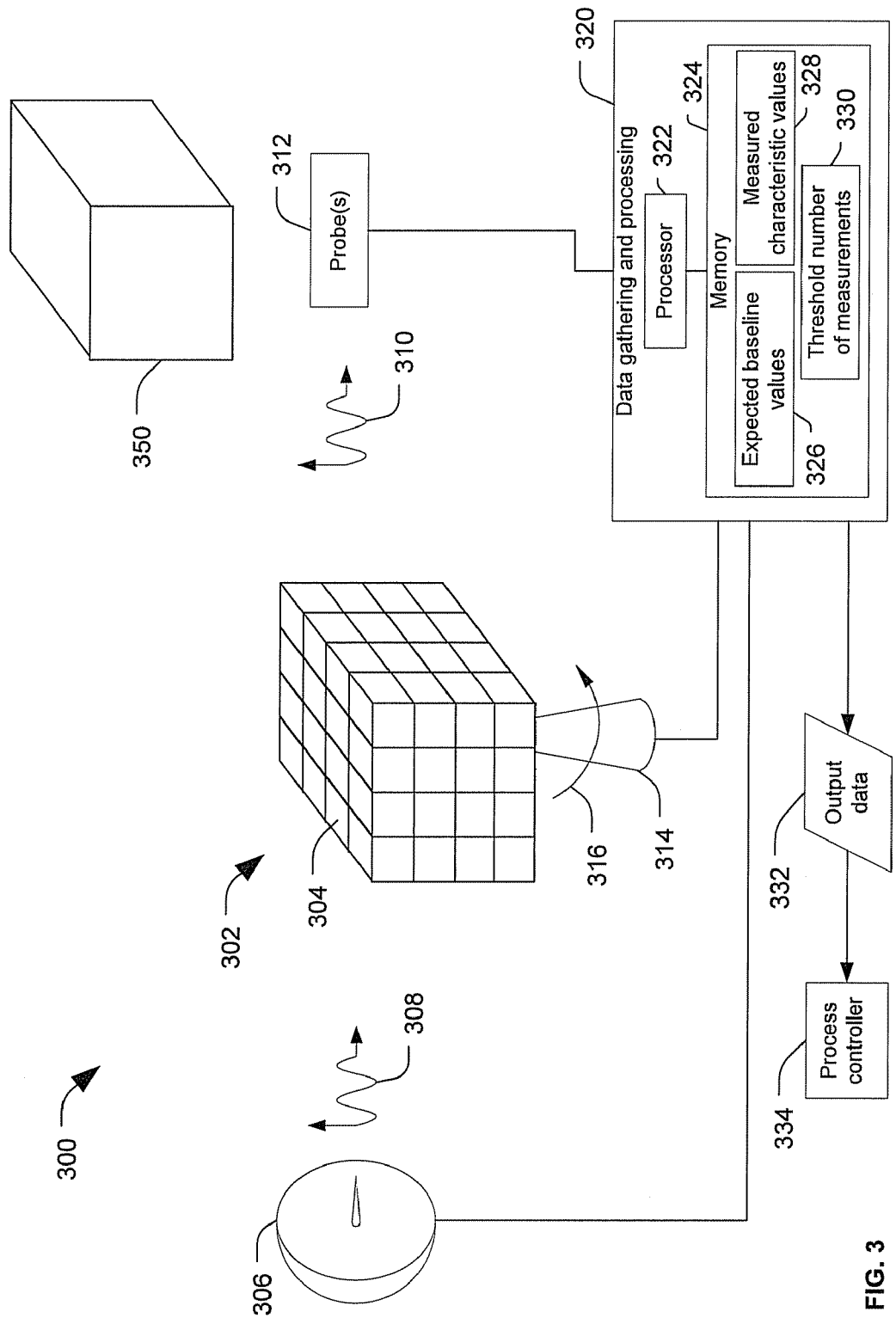
FIG. 3 is a block diagram of a particular embodiment of a system to non-destructively determine electromagnetic properties.

FIG. 3 is a block diagram of a particular embodiment of a system to non-destructively determine electromagnetic properties. The system is generally designated 300. The system 300 may include an antenna 306 to direct an electromagnetic plane wave 308 toward an article under test 302. The article under test 302 may include any article for which electromagnetic properties are to be determined. In an illustrative embodiment, the article under test 302 includes a tailored dielectric material for an aerospace application. For example, the article under test 302 may include an aircraft component or a material to be used to form an aircraft component.

The system 300 may also includes one or more probes 312 to take measurements of electromagnetic energy 310 scattered by the article under test 302. For example, the system 300 may include a plurality of probes 312 to take measurements of the electromagnetic energy 310 scattered by the article under test 302 from different angles. To illustrate, the probes 312 may be distributed around the article under test 302 to take measurements of the electromagnetic energy 310 scattered in various directions by the article under test 302. In another example, the probes 312 may be moveable to take measurements of the electromagnetic energy 310 scattered in various directions by the article under test 302. In a particular embodiment, one or more of the probes 312 may take polarized electromagnetic field measurements. For example, measurements taken by the probes 312 may be used to determine a polarization of the scattered electromagnetic energy 310. The probes 312 may distinguish various polarizations by filtering the scattered electromagnetic energy 310, by employing probes specifically adapted to detect polarity, by rotating the probes 312, or by any combination thereof.

The system 300 may also include a data gathering and processing system 320. The data gathering and processing system 320 may include one or more processors 322 and memory 324 accessible to the one or more processors 322. For example, the data gathering and processing system 320 may include a computer with an interface that enables communication with the probes 312 to receive measurement data related to the measurements taken by the probes 312. In a particular embodiment, the data gathering and processing system 320 may include an interface to control the probes 312. For example, when the probes 312 are moveable, the data gathering and processing system 320 may control movement of the probes 312 to take the measurements.

In a particular embodiment, the data gathering and processing system 320 includes an interface that enables communication with the antenna 306 or a signal generator (not shown) that drives the antenna 306 to produce the electromagnetic plane wave 308. In this embodiment, the data gathering and processing system 320 may control timing or other characteristics of the electromagnetic plane wave 308. For example, the data gathering and processing system 320 may control a frequency of the electromagnetic plane wave 308. The data gathering and processing system 320 may vary the frequency of the electromagnetic plane wave 308 to determine frequency dependent electromagnetic properties of the article under test 302. To illustrate, the frequency may be varied between sets of readings to assess how the electromagnetic properties of the article under test 302 vary with frequency.

In a particular embodiment, the data gathering and processing system 320 includes an interface to communicate with a moveable base 314 or other device to move the article under test 302 during testing. For example, the moveable base 314 may rotate the article under test 302 to various incident angles 316 of the article under test 302 with respect to the electromagnetic plane wave 308. In particular embodiments, the moveable base 314 may also tilt the article under test 302 to change the incident angle of the electromagnetic plane wave 308 in another axis with respect to the article under test 302. Measured characteristic values 328 based on the measurements taken by the probes 312 may be stored at the memory 324. For example, the measured characteristic values may include values indicative of the electromagnetic field detected by the probes 312 at various incident angles 316 and various frequencies of the electromagnetic plane wave 308.

In a particular embodiment, the memory 324 stores expected baseline values 326 of at least one electromagnetic property of the article under test 302. The expected baseline values 326 may include predicted average values of the electromagnetic energy 310 scattered by the article under test at different incident angles 316, different frequencies of the electromagnetic plane wave 308, or both, based on an assumption or expectation that the electromagnetic property is homogenous in the article under test. For example, the expected baseline values 326 may be determined by testing a substantially homogenous control article 350. That is, the expected baseline values 326 may be based on electromagnetic energy scattered by the control article 350. The control article 350 may be a specially manufactured article that is substantially homogenous with respect to the particular electromagnetic property or electromagnetic properties being tested. For example, when the article under test 302 is to be tested to determine whether a value of a dielectric constant is homogenous in the article under test 302, the control article 350 may have a substantially homogenous dielectric constant. The control article 350 may also have a similar size and shape to the article under test 302. In a particular illustrative embodiment, a homogenous electromagnetic property is one that varies by no more than an amount specified in a material specification associated with the article. How much variation is permitted from point to point may depend on the particular application for which the material is to be used.

In a particular embodiment, a threshold number of measurements to be taken 330 may be stored at the memory 324. For example, the processor 322 may determined the threshold number of measurements to be taken 330 of the article under test 302 based on testing of the control article 350. For example, a simulation to determine threshold number of measurements to be taken 330 is described with reference to FIGS. 6 and 7.

The processor 322 may be adapted to determine output data 332 including difference values between the expected baseline values 326 and the measured characteristic values 328 of the article under test 302. The output data 332 may include values indicative of inhomogeneous distribution of an electromagnetic property of the article under test 302. For example, the output data 332 may include a difference value between the expected baseline values 326 and the measured characteristic values 324 for each of a plurality of subdivisions or portions of the article under test 302. To illustrate, the article under test 302 may be subdivided into a plurality of regions 304. The number of regions 304 into which the article under test 302 is divided may be selected based on a desired resolution of the output data 332, capabilities of the measurement system 300, or any combination thereof. The capabilities of the measurement system 300 may depend on an amount of time allowed for testing, a frequency or frequencies of the electromagnetic plane wave 308, a sampling frequency of the probes 312, a number or type of the probes 312, other factors that affect the measurement resolution or speed of the system 300, or any combination thereof. In a particular embodiment, the system 300 is capable of detecting differences between an expected value of a dielectric constant and a measured value of the dielectric constant within regions 304 of the article under test 302 that are about one sixteenth of a wavelength, in the dielectric material, of the electromagnetic plane wave 308. The electromagnetic plane wave 308 may have a frequency in the microwave range. Additionally, as discussed above, the frequency of the electromagnetic plane wave 308 may be varied to determine frequency dependent electromagnetic characteristics of the article under test 302.

In a particular embodiment, the measured characteristic values 328 of the article under test 302 include a difference value between an expected baseline value and a measured value. That is, the article under test 302 may be initially assumed to have a homogenous dielectric constant (e.g., similar to the control article). The processor 322 may generate a data file that includes difference values determined between expected values of scattered electromagnetic energy and the actual or measured values of the electromagnetic energy 310 scattered by the article under test 302 using a distorted wave Born approximation. The data file may also include relative position (e.g., incident angle) of the article under test, the electromagnetic plane wave, and a probe taking the measurement; polarization information related to the electromagnetic plane wave, frequency of the electromagnetic plane wave, other information descriptive of test conditions or measurements, or any combination thereof. In an illustrative embodiment, the difference values may be expressed as a matrix of values estimating electric field values at each region 304 of the article under test 302 at various test conditions (e.g., at each frequency and incident angle of the electromagnetic plane wave 308). The matrix of values may be transformed into the output data 332 using singular value decomposition and pseudo inverse operations.

During operation of a particular embodiment of the system 300, the data gathering and processing system 320 is initialized. For example, the expected baseline values 326 may be stored in the memory 320 or may be determined by directing the electromagnetic plane wave 308 toward the control article 350 and taking measurements of electromagnetic energy scattered by the control article 350. Additionally, the threshold number of measurements to be taken 330 may be stored in the memory 324 or determined by analyzing measurements taken of the control article 350. The data gathering and processing system 320 may determine a test plan for the article under test 302. When the article under test 302 is of a type that is frequently tested, the test plan may be accessed from the memory 324. The test plan may indicate how many measurements are to be taken of the article under test, incident angles for the measurements, frequencies of the electromagnetic plane wave 308 for the measurements, orientations or locations of the probes 312 for the tests, other information to control the system 300 for the measurements, or any combination thereof. The data gathering and processing system 320 may control the system 300 to take measurements of the article under test 302 based on the test plan. For example, the data gathering and processing system 320 may vary the frequency of the electromagnetic plane wave 308 between measurements or during measurements of the article under test 302. In another example, the data gathering and processing system 320 may cause the base 314 to change the incident angle 316 of the electromagnetic plane wave 308 with respect to the article under test 302 by rotating or tilting the article under test 302. In another example, the data gathering and processing system 320 may change the location or orientation (e.g., rotation to gather electromagnetic field polarization information) between measurements or during measurements of the article under test 302.

The data gathering and processing system 320 may determine the output data 332 that includes values indicative of inhomogeneous distribution of an electromagnetic property of the article under test 302. In a particular embodiment, the output data 332 is stored at the memory 324. In another particular embodiment, the output data 332 is sent to a process controller 334. The process controller 334 may include a device or system that controls at least a portion of a manufacturing process of the article under test 302. Thus, the output data 332 may provide a feedback input to the process controller 334 to indicate whether the manufacturing process for the article under test 302 is performing satisfactorily. To illustrate, the article under test 302 may be associated with a product specification that includes an inhomogeneity threshold. The output data 332 may provide information to the process controller 334 that indicates whether the inhomogeneity threshold is satisfied by the article under test 302. In response to the output data 332, the process controller 334 may adjust the manufacturing process of the article under test 302 to satisfy the inhomogeneity threshold.

Figure 4:
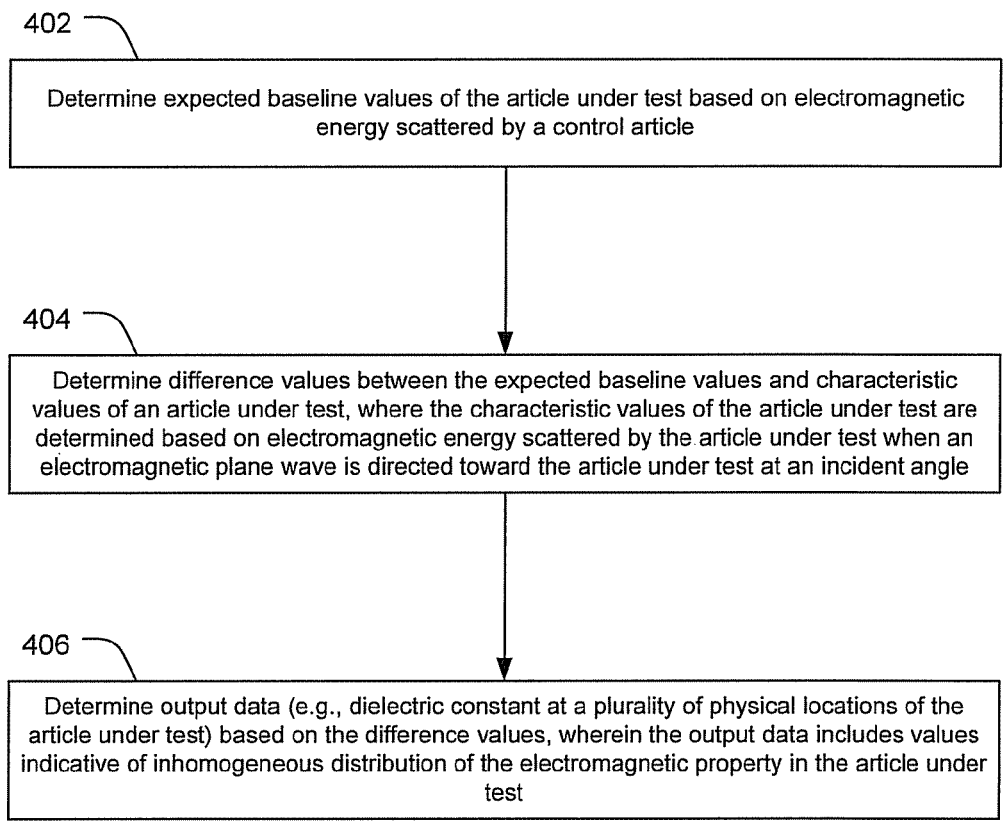
FIG. 4 is a flow diagram of a first embodiment of a non-destructive method to determine electromagnetic properties.

FIG. 4 is a flow diagram of a first embodiment of a non-destructive method to determine electromagnetic properties. In a particular embodiment, the method may be implemented using a measurement system such as the system 300 of FIG. 3. The method includes, at 402, determining expected baseline values of an article under test based on electromagnetic energy scattered by a control article. For example, the expected baseline values may be accessed from a memory or may be measured by directing an electromagnetic plane wave toward the control article and taking readings of the electromagnetic energy scattered by the control article.

The method also includes, at 404, determining difference values between the expected baseline values and characteristic values of the article under test. In a particular embodiment, the difference values may be determined using distorted wave Born approximation with respect to measurements taken of the article under test. The characteristic values of the article under test may be determined based on electromagnetic energy scattered by the article under test when an electromagnetic plane wave is directed toward the article under test. The expected baseline values used for the distorted wave Born approximation may include expected electromagnetic field values based on readings taken of the control article, where the control article has a substantially homogeneous distribution of a particular electromagnetic property being tested.

In a particular embodiment, the method also includes, at 406, determining output data based on the difference values. The output data may include values indicative of inhomogeneous distribution of an electromagnetic property of the article under test. In an illustrative embodiment, the output data may be determined using singular value decomposition of data including the difference values. In an illustrative embodiment, the inhomogeneous distribution of the electromagnetic property includes values of a dielectric constant of the article under test at a plurality of physical locations. The output data may be stored in a memory, sent to a manufacturing control system, or both.

Figure 5:
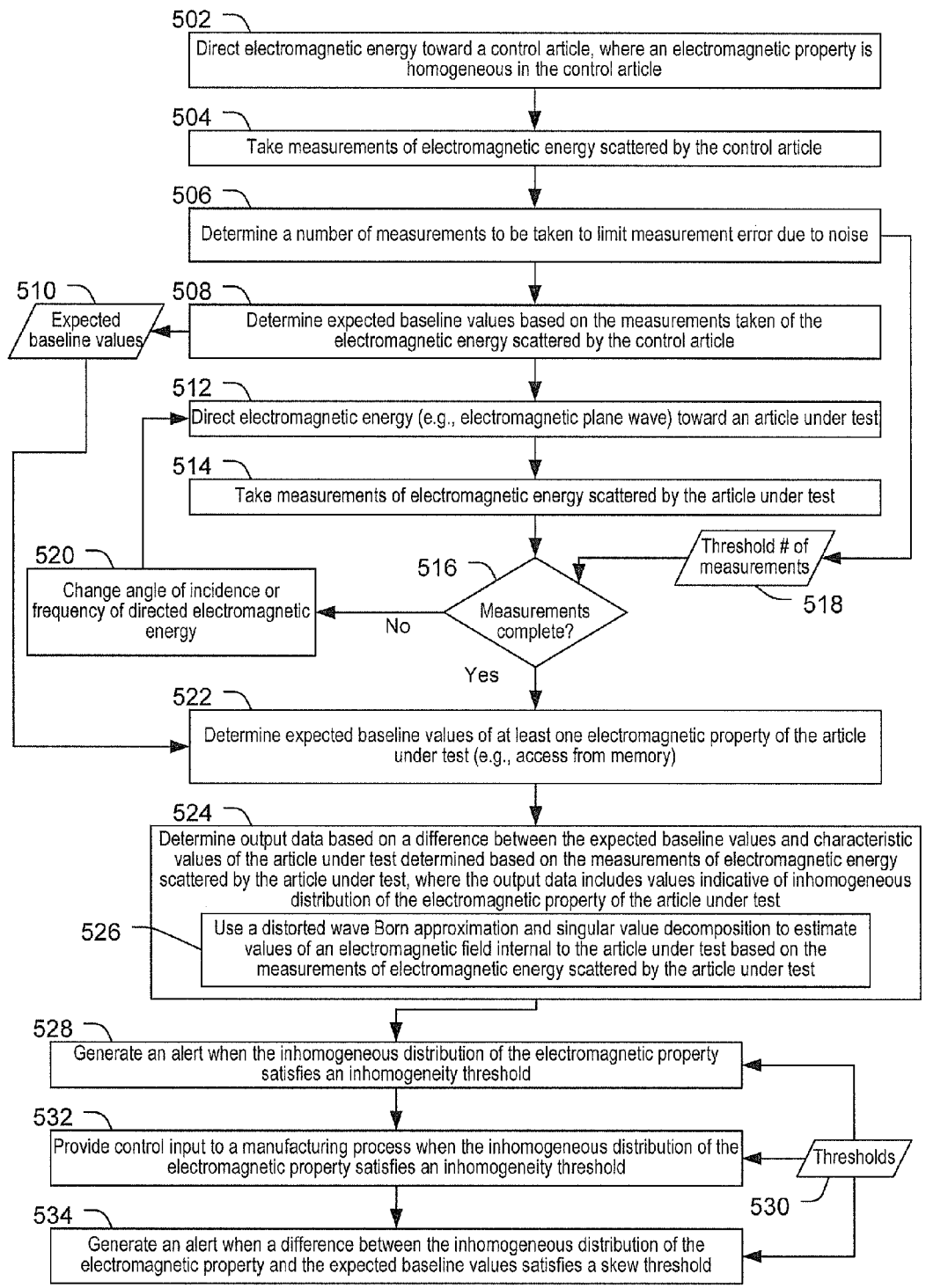
FIG. 5 is flow diagram of a second embodiment of a non-destructive method to determine electromagnetic properties.

FIG. 5 is flow diagram of a second embodiment of a non-destructive method to determine electromagnetic properties. The method may include, at 502, directing electromagnetic energy toward a control article and, at 504, taking measurements of electromagnetic energy scattered by a control article. A particular electromagnetic property may be substantially homogeneous in the control article. The measurements of the electromagnetic energy scattered by the control article may be used to determine a threshold number of measurements to be taken of an article under test 518 to limit measurement error due to noise, at 506.

The method may also include, at 508, determining expected baseline values 510 of the article under test based on the measurements taken of the electromagnetic energy scattered by the control article. For example, the particular electromagnetic property that is homogeneous in the control article may have a value that is approximately an expected average value (e.g., a specified value) of the particular electromagnetic property in the article under test. Thus, by taking electromagnetic field readings of the electromagnetic energy scattered by the control article, expected electromagnetic field values of electromagnetic energy that should be scattered by the article under test can be determined.

In a particular embodiment, the method includes, at 512, directing electromagnetic energy toward an article under test. For example, the electromagnetic energy may include one or more electromagnetic plane waves. Measurements of electromagnetic energy scattered by the article under test may be taken, at 514. In an illustrative embodiment, additional measurements of the electromagnetic energy scattered by the article under test may be taken until the threshold number of measurements 518 is satisfied. For example, a testing plan may specify measurements to be taken, and the measurements may continue to be taken until the testing plan is complete. In another example, as illustrated in FIG. 5, the method may include determining whether the measurements to be taken are complete, at 516, based on the threshold number of measurements 518. When the measurements are not complete, additional measurements may be taken by directing additional electromagnetic energy toward the article under test, at 512. In a particular embodiment, test conditions may be modified before the additional electromagnetic energy is directed toward the article under test. For example, the angle of incidence or frequency of the directed electromagnetic energy may be changed, at 520.

When no additional measurements are to be taken, the method may determine the expected baseline values 510 of at least one electromagnetic property of the article under test, at 522. When the expected baseline values 510 have previously been determined (e.g., at 508), the expected baseline values 510 may be accessed from a memory.

In a particular embodiment, the method includes, at 524, determining output data based on a difference between the expected baseline values and characteristic values of the article under test determined based on the measurements of electromagnetic energy scattered by the article under test. For example, a singular value decomposition may be performed with respect to a data matrix including data based on a distorted wave Born approximation of expected baseline values and measured values of the article under test. To illustrate, at 526, a distorted wave Born approximation and singular value decomposition may be used to estimate values of an electromagnetic field internal to the article under test based on the measurements of electromagnetic energy scattered by the article under test. The output data may include values indicative of inhomogeneous distribution of an electromagnetic property of the article under test. In a particular illustrative embodiment, the inhomogeneous distribution of the electromagnetic property in the article under test is determined to about one sixteenth of a wavelength, in the dielectric material, of the electromagnetic energy. In this particular embodiment, the inhomogeneous distribution of the electromagnetic property may be determined with about thirty-five percent or less error.

In a particular embodiment, the inhomogeneous distribution of the electromagnetic property in the article under test may be compared to one or more thresholds 530. For example, the thresholds 530 may include an inhomogeneity threshold. To illustrate, the inhomogeneity threshold may specify a maximum amount of point to point variation allowed in the article under test. An alert may be generated when the inhomogeneous distribution of the electromagnetic property satisfies the inhomogeneity threshold. To illustrate, when the distribution of the electromagnetic property in the article under test varies more than the inhomogeneity threshold from one region of the article under test to another, the alert may be generated. The alert may indicate that the article under test is unacceptable. Additionally or in the alternative, when the inhomogeneity threshold is satisfied, a control input may be provided to a manufacturing process associated with the article under test, at 532. The control input may include information used by the manufacturing process to correct or improve the manufacturing process to bring subsequent articles into conformance (e.g., to cause the subsequent articles to not satisfy the inhomogeneity threshold).

In another example, the thresholds 530 may include a skew threshold. The skew threshold may indicate a level of allowable deviation from an expected value of the electromagnetic property. To illustrate, the skew value may indicate that the dielectric constant of the article under test may vary no more than a specified amount from an expected value of the dielectric constant. An alert may be generated when a difference between the inhomogeneous distribution of the electromagnetic property and the expected baseline values satisfies the skew threshold, at 534. The alert may indicate that the article under test is unacceptable. In an illustrative embodiment, when the skew threshold is satisfied, a control input may be provided to a manufacturing process associated with the article under test. The control input may include information used by the manufacturing process to correct or improve the manufacturing process to bring subsequent articles into conformance (e.g., to cause the subsequent articles to not satisfy the skew threshold).

Figure 6:
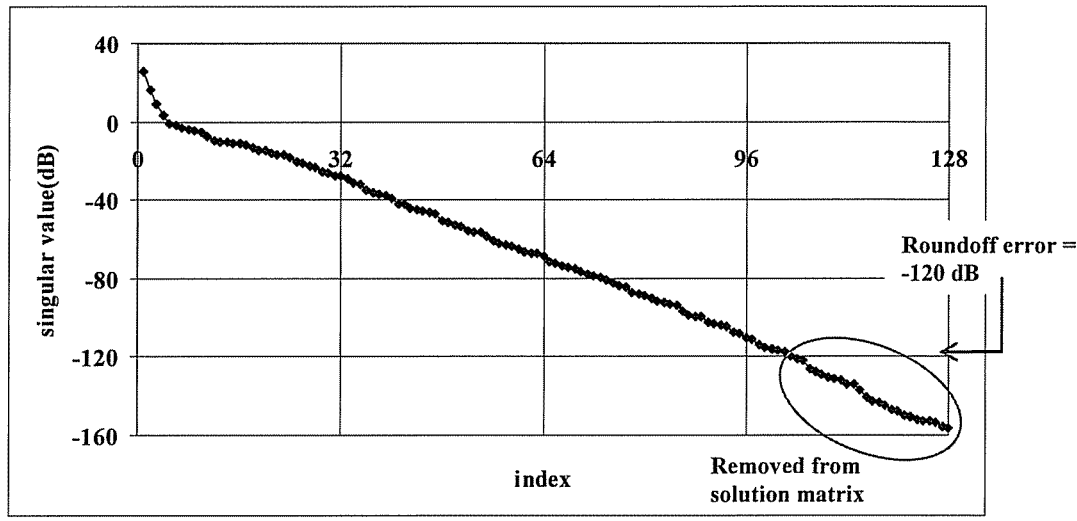
FIGS. 6 and 7 are diagrams illustrating data from a simulation of an embodiment of a non-destructive method to determine electromagnetic properties.
Figure 7:
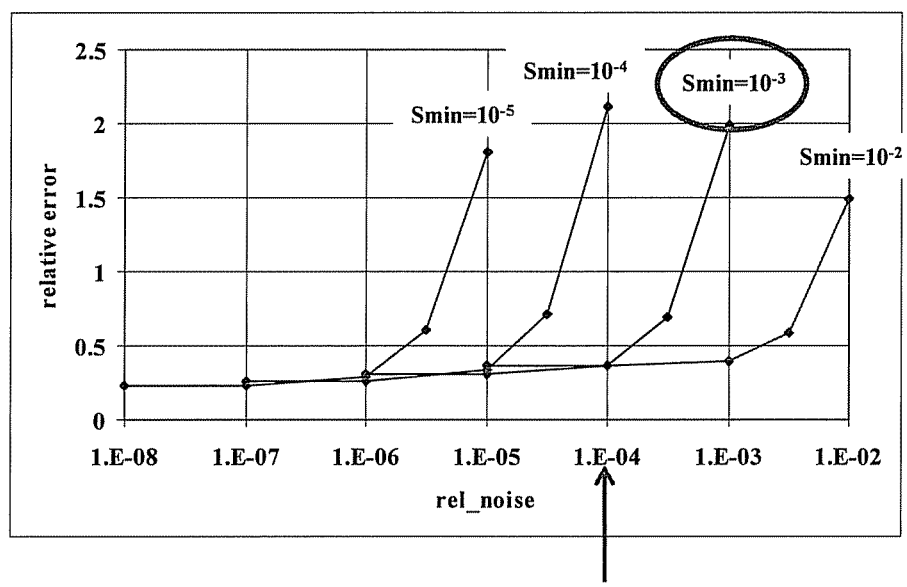

FIGS. 6 and 7 illustrate results of computer simulations of a non-destructive method to determine electromagnetic properties. To generate the results illustrated in FIG. 6, a distorted wave Born approximation and singular value decomposition method was simulated with respect to a measurement system, such as the system illustrated in FIG. 3. Various electromagnetic field measurement points (e.g., locations of the probes 312 of FIG. 3) and incident plane wave illumination angles were considered to evaluate trade-offs between measurement cost and quality of an output data matrix. To simplify the simulation, inhomogeneous components of a dielectric constant of the article under test were restricted to vary only in an x-y plane of the article under test. Additionally, both measurement points and illumination angles were restricted to the x-y plane. At a selected frequency of the electromagnetic plane wave of 150 MHz, and with a baseline dielectric value of 2.5, the resolution of the measurements is about 0.038*lambda (free space) and 0.060*lambda (dielectric).

Information content of the output data matrix may be incorporated in its singular values. The simulated system had 128 internal complex unknowns corresponding to rectangular columns obtained by subdividing the article under test across the x-y plane into 6 inch squares. The columns extended vertically in the z-direction to the upper and lower surfaces of the article under test. Each column had 4 field points in the x-y plane, giving a total of 4×4×8=128 points at which the interior inhomogeneous dielectric constant of the article under test was to be determined. Electromagnetic fields in the simulation were allowed to vary in three dimensions; only the dielectric inhomogeneity was restricted to variation within the x-y plane.

In the simulation, the output data matrix related M measurement points at N illumination angles to the 128 interior points. Thus, the output data matrix was non-square, with MN rows and 128 columns. The unknowns for which one could solve the system of equations include the inhomogeneous dielectric values at the corresponding interior points. The total dielectric of each interior point is the sum of the baseline (constant) value and the inhomogeneous component at the corresponding interior point.

Referring to FIG. 6, the singular values are displayed in order of decreasing magnitude (in dB) to illustrate data quality in an intuitive manner. If all of the values were usable, then the output data matrix would include sufficient information to calculate all 128 unknowns from the output data matrix. However, when the output data matrix includes values that are below a noise level or computer round off error, these values are unusable and should be eliminated, thereby reducing the accuracy of the solution for the 128 unknowns. For example, as shown in FIG. 6, a round off error of −120 dB will eliminate the last 26 singular values, leaving only the first 102 values, which may reduce solution accuracy. The case illustrated in FIG. 6 is for 40 measurement points and 8 illumination angles. Increasing or decreasing the number of measurement points or the number of illumination angles may improve or degrade data accuracy accordingly and may be quantified by comparing singular value spectra.

The singular values illustrated in FIG. 6 are for a noise-free environment. When measurement noise is present, solution accuracy may be degraded as the noise level increases. To provide quantitative results, an inhomogeneous dielectric component was simulated using random numbers. Since the inhomogeneous term, del(eps), is the difference between the actual and the average, both real and imaginary parts were uniformly distributed over the relative range [−0.5,0.5], i.e., +/−50% deviation.

Noise of various levels was simulated, the pseudo-inverse was applied and true and estimated solutions for del(eps) were compared to compute the root mean square (RMS) error between the two. The noise was scaled by first obtaining the data values, y (position, illumination angle), from the input dielectric values and data matrix, computing the RMS of y, and scaling the randomly generated noise to have the RMS given by RMS(noise)=fact*RMS(y), where fact is a scale factor displayed on the x-axis of FIG. 7 and is roughly equivalent to the inverse of the signal-to-noise ratio for the particular test and input inhomogeneous dielectric component.

As shown in FIG. 7, the cutoff for a minimum allowable singular value in the pseudo-inverse was determined to be about 10× the noise level. Attempting to get better accuracy by including more singular values is equivalent to amplifying numerical or system noise and may dramatically increase solution error. The relative noise level of 1e-4 indicated by the arrow indicates that singular values below about 1e-3 should be discarded, resulting in a best case RMS solution error of about 35%. Attempting to retain more singular values may greatly exacerbate the solution error as indicated. For example, as illustrated in FIG. 7, keeping singular values down to 1e-4 results in an error of about 210%. Thus, by applying the analysis above to readings taken of electromagnetic energy scattered by a control article, a number of measurements to be taken of an article under test may be determined to decrease costs and to reduce error in the output data.

The disclosed systems and methods of determining electromagnetic properties enable efficient (e.g., low cost and non-destructive) determination of the electromagnetic properties. Additionally, frequency dependent characteristics of the electromagnetic properties can be determined.

The disclosed systems and methods provide cost savings on the manufacture of tailored dielectric materials by preventing the waste inherent in destructive/invasive evaluation and measurement of material properties. The disclosed systems and methods may also provide information essential for refining the manufacturing process. Thus, significant cost savings may be achieved.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, claimed subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A method, comprising:
   directing electromagnetic energy toward an article under test;
   taking measurements of electromagnetic energy scattered by the article under test;
   determining expected baseline values of at least one electromagnetic property of the article under test, wherein the expected baseline values are determined based on measurements of electromagnetic energy scattered by a control article;
   determining a difference between the expected baseline values and characteristic values of the article under test, wherein the characteristic values of the article under test are determined based on measurements of electromagnetic energy scattered by the article under test; and
   determining output data based on the determined difference between the expected baseline values and the characteristic values of the article under test, wherein the output data includes values that indicate a distribution of the at least one electromagnetic property of the article under test, and wherein the output data is determined using a distorted wave Born approximation and singular value decomposition to estimate values of an electromagnetic field internal to the article under test based on the measurements of the electromagnetic energy scattered by the article under test.

2. The method of claim 1, further comprising determining a number of measurements to be taken of the electromagnetic energy scattered by the article under test to limit measurement error due to noise before determining the output data.

3. The method of claim 2, wherein the number of measurements to be taken of the electromagnetic energy scattered by the article under test is determined based on the measurements of the electromagnetic energy scattered by the control article, and wherein a distribution of the at least one electromagnetic property of the control article is substantially homogeneous.

4. The method of claim 1, further comprising:
   taking the measurements of electromagnetic energy scattered by the control article; and
   generating the expected baseline values based on the measurements taken of the electromagnetic energy scattered by the control article.

5. The method of claim 1, wherein a distribution of the at least one electromagnetic property of the control article is substantially homogeneous.

6. The method of claim 1, wherein the electromagnetic energy is directed toward the article under test from a plurality of incident angles.

7. The method of claim 1, wherein the electromagnetic energy comprises an electromagnetic plane wave.

8. The method of claim 1, wherein the distribution of the electromagnetic property of the article under test is determined to about one sixteenth of a wavelength of the electromagnetic energy in a dielectric material.

9. The method of claim 8, wherein the distribution of the electromagnetic property of the article under test is determined with about thirty-five percent or less error.

10. A non-transitory computer-readable storage medium, comprising:
    instructions executable by a processor to access expected baseline values of an article under test, wherein the expected baseline values are determined based on measurements of electromagnetic energy scattered by a control article;
    instructions executable by the processor to determine difference values between the expected baseline values and characteristic values of the article under test, wherein the characteristic values of the article under test are determined based on measurements of electromagnetic energy scattered by the article under test when an electromagnetic plane wave is directed toward the article under test; and
    instructions executable by the processor to generate output data based on the determined difference values, wherein the output data indicates a distribution of an electromagnetic property of the article under test, and wherein the output data is generated using a distorted wave Born approximation and singular value decomposition to estimate values of an electromagnetic field internal to the article under test based on the measurements of the electromagnetic energy scattered by the article under test.

11. The non-transitory computer-readable storage medium of claim 10, wherein the distribution of the electromagnetic property includes values of a dielectric constant of the article under test at a plurality of physical locations.

12. The non-transitory computer-readable storage medium of claim 10, further comprising instructions executable by the processor to provide control input to a manufacturing process when the distribution of the electromagnetic property of the article under test satisfies an inhomogeneity threshold, wherein the control input includes information used to modify the manufacturing process, and wherein a distribution of the electromagnetic property of a subsequent article under test manufactured by the modified manufacturing process does not satisfy the inhomogeneity threshold.

13. The non-transitory computer-readable storage medium of claim 10, further comprising instructions executable by the processor to generate an alert when the distribution of the electromagnetic property of the article under test satisfies an inhomogeneity threshold.

14. The non-transitory computer-readable storage medium of claim 10, further comprising instructions executable by the processor to generate an alert when a difference between the distribution of the electromagnetic property of the article under test and the expected baseline values satisfies a skew threshold.

15. A system, comprising:
   an antenna to direct an electromagnetic plane wave toward an article under test;
   at least one probe to take measurements of electromagnetic energy scattered by the article under test;
   a memory storing expected baseline values of at least one electromagnetic property of the article under test, wherein the expected baseline values are determined based on measurements of electromagnetic energy scattered by a control article; and
   a processor to:
      determine difference values between the expected baseline values and a plurality of measured characteristic values of the article under test, wherein the plurality of measured characteristic values are determined based on the measurements of electromagnetic energy scattered by the article under test; and
      generate output data based on the determined difference values that indicate a distribution of the at least one electromagnetic property of the article under test, wherein the output data is generated using a distorted wave Born approximation and singular value decomposition to estimate values of an electromagnetic field internal to the article under test based on the measurements of the electromagnetic energy scattered by the article under test.

16. The system of claim 15, wherein a distribution of the at least one electromagnetic property of the control article is substantially homogenous.

17. The system of claim 15, wherein the electromagnetic plane wave has a frequency in a microwave range.

18. The system of claim 15, wherein the measurements of the electromagnetic energy scattered by the article under test include measurements at multiple frequencies, and wherein the processor is further configured to identify frequency dependent electromagnetic characteristics of the article under test.

19. The system of claim 15, wherein the article under test comprises an aircraft component.

* * * * *